(12) United States Patent
Wu et al.

(10) Patent No.: US 8,592,943 B2
(45) Date of Patent: Nov. 26, 2013

(54) SYMMETRICAL CENTER TAP INDUCTOR STRUCTURE

(75) Inventors: Zhaoyin D. Wu, San Jose, CA (US);
Xuewen Jiang, Chandler, AZ (US);
Parag Upadhyaya, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 407 days.

(21) Appl. No.: 13/052,293

(22) Filed: Mar. 21, 2011

(65) Prior Publication Data
US 2012/0241904 A1 Sep. 27, 2012

(51) Int. Cl.
*H01L 21/00* (2006.01)

(52) U.S. Cl.
USPC .......................... 257/531; 257/277; 336/200

(58) Field of Classification Search
USPC .................................. 257/531, 27; 336/200
See application file for complete search history.

(56) References Cited

U.S. PATENT DOCUMENTS

| | | | |
|---|---|---|---|
| 6,753,591 B2 | 6/2004 | Yu | |
| 6,759,937 B2 * | 7/2004 | Kyriazidou | 336/200 |
| 6,927,664 B2 * | 8/2005 | Nakatani et al. | 336/200 |
| 6,940,386 B2 * | 9/2005 | Mukherjee et al. | 336/200 |
| 7,091,814 B2 * | 8/2006 | Kyriazidou | 336/200 |
| 7,489,221 B2 * | 2/2009 | Barrett et al. | 336/200 |
| 7,911,310 B2 * | 3/2011 | Barrett et al. | 336/200 |
| 8,427,266 B2 * | 4/2013 | Wu et al. | 336/84 C |
| 2003/0222750 A1 | 12/2003 | Kyriazidou | |
| 2004/0085175 A1 | 5/2004 | Lowther | |
| 2004/0108935 A1 * | 6/2004 | Kyriazidou | 336/200 |
| 2008/0074229 A1 | 3/2008 | Moinian et al. | |
| 2008/0136574 A1 | 6/2008 | Jow et al. | |
| 2009/0146252 A1 | 6/2009 | Huang et al. | |
| 2009/0152674 A1 | 6/2009 | Uchida et al. | |
| 2010/0193904 A1 * | 8/2010 | Watt et al. | 257/531 |

FOREIGN PATENT DOCUMENTS

| | | |
|---|---|---|
| EP | 1 213 762 A1 | 6/2002 |
| WO | WO 2009/101565 A1 | 8/2009 |

OTHER PUBLICATIONS

U.S. Appl. No. 13/052,310, filed Mar. 21, 2011, Wu et al.
Chen, Y. Emery et al., "Q-Enhancement of Spiral Inductor with $N^+$-Duffusion Patterned Ground Shields," *2001 IEEE MTT-S International Microwave Symposium Digest*, May 20, 2001, pp. 1289-1292, vol. 2, IEEE, Piscataway, New Jersey, USA.

* cited by examiner

*Primary Examiner* — Jarrett Stark
*Assistant Examiner* — Nicholas Tobergte
(74) *Attorney, Agent, or Firm* — Kevin T. Cuenot; LeRoy D. Maunu

(57) ABSTRACT

An inductor structure implemented within a semiconductor integrated circuit (IC) can include a coil of conductive material that includes a center terminal located at a midpoint of a length of the coil. The coil can be symmetrical with respect to a centerline bisecting the center terminal. The coil can include a first differential terminal and a second differential terminal each located at an end of the coil and opposite the center terminal. The inductor structure can include an isolation ring surrounding the coil. In some cases, the inductor structure can include a return line of conductive material positioned on the center line.

18 Claims, 5 Drawing Sheets

SYMMETRICAL CENTER TAP INDUCTOR STRUCTURE

FIELD OF THE INVENTION

One or more embodiments disclosed within this specification relate to integrated circuits (ICs). More particularly, one or more embodiments relate to a center tap inductor structure implemented within an IC.

BACKGROUND

The frequency of signals associated with integrated circuits (ICs), whether generated within the IC or exchanged with devices external to the IC, has steadily increased over time. As IC signals reach radio frequency (RF) ranges exceeding a gigahertz, it becomes viable to implement inductor structures within ICs. Implementing an inductor structure within an IC, as opposed to using an external inductor device, typically reduces the manufacturing and implementation costs of the system requiring the inductor. IC inductors can be implemented within a variety of RF circuits such as, for example, low noise amplifiers (LNAs), voltage controlled oscillators (VCOs), input or output matching structures, power amplifiers, and the like. Many of these RF circuits, such as certain VCO architectures, can be implemented as differential circuits that rely on circuit and/or device symmetry to provide maximum circuit performance.

Although IC inductors are advantageous in many respects, IC inductors introduce various non-idealities not present with external or discrete inductors. For example, an IC inductor is typically surrounded by other semiconductor devices that can generate noise. As IC devices reside over a common substrate material that is conductive, signals and noise generated by an IC device can be coupled into an IC inductor built over the common substrate material. Although IC inductors are typically built within one or more metal interconnect layers that reside farthest from the substrate layer, finite parasitic capacitances exist between the substrate layer and the metal interconnect layer(s). These parasitic capacitances can couple signals between the IC inductor and the substrate layer. Further, eddy currents induced within the substrate layer by an IC inductor can generate losses that reduce the quality factor, or so called "Q," of the IC inductor.

Other non-idealities relate to the ability of interconnect lines routed in the vicinity of the IC inductor, particularly large ground and power supply lines, to couple signals both capacitively and inductively to the inductor. In addition, inductive coupling resulting from neighboring metal lines can alter the inductive value and self resonance of an IC inductor.

Each of the non-idealities described can interfere with the implementation of an IC inductor as a consistent and reproducible element whose parameters are independent of the IC environment within which the IC inductor resides.

SUMMARY

One or more embodiments disclosed within this specification relate to integrated circuits (ICs) and, more particularly, to an inductor structure implemented within an IC.

An embodiment disclosed within this specification can include an inductor structure implemented within a semiconductor IC. The inductor structure can include a coil of conductive material that includes a center terminal located at a midpoint of a length of the coil. The coil can be symmetrical with respect to a centerline bisecting the center terminal. The coil can include a first differential terminal and a second differential terminal each located at an end of the coil opposite the center terminal. The inductor structure can include a return line of conductive material coupled to the coil and located in a different conductive layer of the IC than the coil. The return line can be positioned on the centerline.

The inductor structure also can include an isolation ring. The isolation ring can surround the coil and can be separated from the coil by approximately a constant and predetermined distance. In one aspect, the isolation ring can have a first end and a second end separated by a predetermined distance forming an opening. For example, the first end and the second end of the isolation ring can be equidistant from the centerline.

In another aspect, the isolation ring can be coupled to the return line at a location opposite the center terminal. When in a circuit in which the inductor structure is implemented, the isolation ring can be coupled, at a midpoint of a length of the isolation ring, to a virtual AC ground of the circuit.

In another aspect, no supply voltage interconnect and no ground interconnect can be located within the isolation ring. Further, no supply voltage interconnect and no ground interconnect can be permitted to cross the centerline within a predetermined distance of the isolation ring.

In a further aspect, a length of the return line can be approximately equal to a diameter of the coil at the centerline.

Another embodiment can include an inductor structure implemented within a semiconductor IC. The inductor structure can include a coil of conductive material having a center terminal located at a midpoint of a length of the coil. The coil can be symmetrical with respect to a centerline bisecting the center terminal. The coil can include a first differential terminal and a second differential terminal each located at an end of the coil opposite the center terminal. The inductor structure also can include an isolation ring surrounding the coil and separated from the coil by approximately a constant and predetermined distance. The isolation ring can include a first end and a second end separated by a predetermined distance forming an opening in the isolation ring.

The inductor structure also can include a return line of conductive material located in different conductive layer of the IC than the coil. The return line can be positioned on the centerline substantially within the coil. In one aspect, a length of the return line can be approximately equal to a diameter of the coil at the centerline.

The first end and the second end of the isolation ring can be equidistant from the centerline. The first end and the second end further can be located closer to the center terminal than either of the differential terminals of the coil. In another aspect, the isolation ring can be coupled to an end of the return line that is opposite the center terminal.

The isolation ring further can be coupled, at a midpoint of a length of the isolation ring, to a virtual AC ground when in a circuit in which the inductor structure is implemented.

In another aspect, no supply voltage interconnect and no ground interconnect can be located within the isolation ring. Further, no supply voltage interconnect and no ground interconnect can be permitted to cross the centerline within a predetermined distance of the isolation ring.

Another embodiment can include an inductor structure implemented within a semiconductor IC. The inductor structure can include a plurality of coils of conductive material including a center terminal located at a midpoint of a length of the plurality of coils. Each of the plurality of coils can be symmetrical with respect to a centerline bisecting the center terminal. The plurality of coils can include a first differential terminal and a second differential terminal each located at an end of the plurality of coils. The inductor structure can include an isolation ring surrounding the plurality of coils and separated from the plurality of coils by approximately a constant and predetermined distance. The isolation ring can include a first end and a second end separated by a predetermined distance forming an opening in the isolation ring.

The first end and the second end of the isolation ring can be equidistant from the centerline. The first end and the second end also can be located external to a portion of the plurality of coils opposite the center terminal, the first differential terminal, and the second differential terminal.

The center terminal can be located on a same side of the plurality of coils as, and between, the first and second differential terminals.

When in a circuit in which the inductor structure is implemented, the isolation ring can be coupled, at a midpoint of a length of the isolation ring, to a virtual AC ground of the circuit.

In another aspect, no supply voltage interconnect and no ground interconnect are located within the isolation ring. Further, no supply voltage interconnect and no ground interconnect can be permitted to cross the centerline within a predetermined distance of the isolation ring.

DETAILED DESCRIPTION

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary of the inventive arrangements. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to an inductor structure for use within an IC. In accordance with one or more embodiments disclosed herein, a center tap inductor structure can be implemented that includes a return line within the inductor structure. The inductor structure can be implemented with a single turn coil constructed symmetrically about a center line that bisects the coil. When implemented within a high frequency differential circuit, the center tap of the inductor structure can receive a current used to bias the high frequency differential circuit. The return line can be routed along the centerline of the single turn coil and used as a return path for the bias current to ground. In this manner, the bias current flowing within the circuit is returned to ground along the centerline of the inductor structure.

An isolation ring can be configured to surround the single turn coil of the inductor structure. The isolation ring can be implemented with an opening located where the isolation ring intersects the centerline. The opening prevents currents induced within the isolation ring, by the single turn coil coupling to the isolation ring, from circularly flowing within the isolation ring. Routing the return line along the centerline of the inductor and breaking the current path in the isolation ring produces an inductor structure with greater differential symmetry. In addition, the parameters of the inductor structure demonstrate less variability when exposed to the effects of inductive and capacitive coupling.

Figure 1:
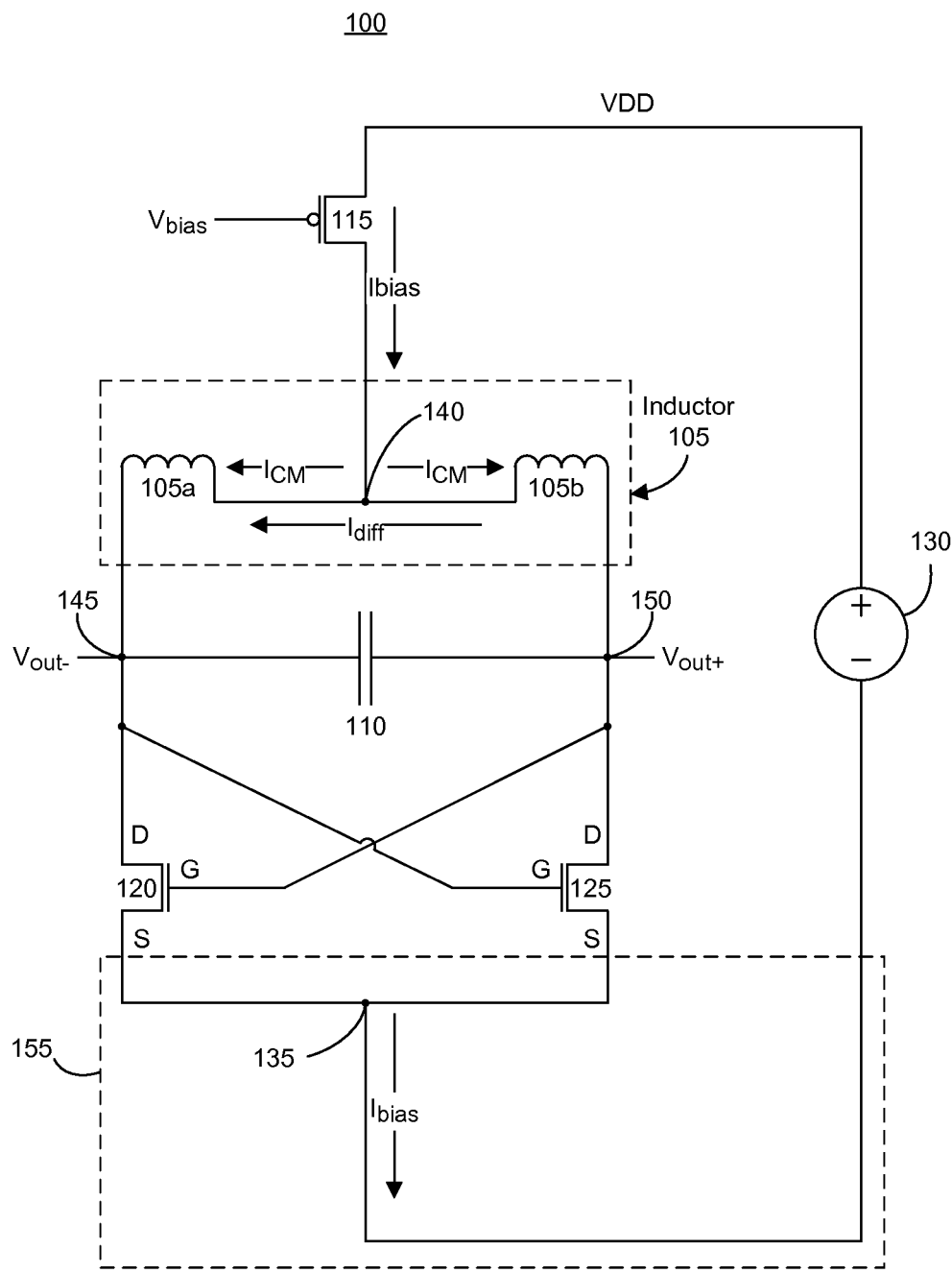
FIG. 1 is a circuit diagram illustrating an exemplary circuit implemented with a center tap inductor in accordance with an embodiment disclosed within this specification.

FIG. 1 is a circuit diagram illustrating an exemplary circuit 100 implemented with a center tap inductor in accordance with an embodiment disclosed within this specification. More particularly, circuit 100 can be a radio frequency (RF) differential circuit including a single turn center tap inductor. FIG. 1 is presented to illustrate electrical properties of a physical inductor structure and the non-idealities that are typically associated with an IC center tap inductor when implemented within an RF differential circuit such as circuit 100. It should be appreciated, however, that FIG. 1, being a circuit diagram, is not intended to convey or illustrate physical location, e.g., layout, of the various components shown. As used within this specification, a "layout" or "IC layout," can refer to a representation of an IC in terms of planar geometric shapes which correspond to the design masks that pattern the metal layers, the oxide regions, the diffusion areas, or other layers that form devices of the IC.

Circuit 100 represents a circuit architecture for a voltage controlled oscillator (VCO) within an IC. As shown, circuit 100 can include an inductor 105, a capacitor 110, a P-type metal oxide semiconductor (PMOS) current source 115, and an N-type metal oxide semiconductor devices (NMOSs) 120 and 125. Within circuit 100, inductor 105 and capacitor 110 are coupled in parallel across nodes 145 and 150 to form an L-C tank circuit. The L-C tank circuit determines an oscillation frequency of the VCO implemented with circuit 100. The oscillation frequency of circuit 100 is a product of the value of inductor 105 and the value of capacitor 110 of the L-C tank. Within circuit 100, inductor 105 can be implemented as a center tap inductor. More particularly, inductor 105 can be implemented as a symmetrical single turn center tap inductor. As used within this specification, a "center tap" or "center terminal," refers to a coupling point made at a midpoint in a length of windings or coils of an inductor. In addition, inductor 105 can be a symmetrical center tap inductor, wherein inductor 105 is physically symmetrical on either side of a centerline that bisects a center terminal 140.

Although a continuous series of windings or coils, a center tap inductor can be modeled as two discrete inductors of equal value coupled in series. For example, in FIG. 1, inductor 105 is represented as two inductors coupled in series, denoted as inductors 105a and 105b. By implementing inductor 105 as a symmetrical center tap inductor coupled at the inductor midpoint, matching between inductors 105a and 105b can be improved. As circuit 100 is a differential circuit, improving the matching between inductors 105a and 105b can improve the differential symmetry and performance of circuit 100.

Center terminal 140 is coupled to a drain of PMOS current source 115. A source of PMOS current source 115 is coupled to a voltage source 130 having a voltage potential of VDD. A gate of PMOS current source 115 receives a bias voltage, denoted as $V_{bias}$. The voltage potential of $V_{bias}$ can determine a quantity of bias current, denoted as $I_{bias}$, sourced by PMOS current source 115 to center terminal 140. Through center terminal 140, the current $I_{bias}$ can flow into inductor 105.

Nodes 145 and 150 form the differential output of circuit 100. As such, the differential output voltage of circuit 100 is equal to the voltage difference between signals $V_{out+}$ and $V_{out-}$. A drain of NMOS 120 and a gate of NMOS 125 are coupled to node 145. A drain of NMOS 125 and a gate of NMOS 120 are coupled to node 150. A source of each of NMOSs 120 and 125 is coupled to node 135 and to a negative voltage potential of source 130 that is typically the ground potential of circuit 100. NMOSs 120 and 125, taken together, form a cross-coupled differential pair containing a positive feedback loop. The positive feedback loop has a closed path from the gate of NMOS 120 to the gate of NMOS 125 via the drain of NMOS 120 and back to the gate of NMOS 120 via the drain of NMOS 125.

In order to induce oscillation within circuit 100, a current $I_{bias}$ can be injected into inductor 105 at center terminal 140. The current $I_{bias}$ establishes a predetermined operating point within each of NMOSs 120 and 125. Properly designed to meet a set of oscillation conditions, for example, a gain of greater than one in the positive feedback loop of NMOSs 120 and 125, NMOSs 120 and 125 in conjunction with inductor 105 and capacitor 110 can combine to form an oscillator. In one or more embodiments, capacitor 110 can be implemented with a varactor, i.e., a voltage controlled variable capacitor, in order to vary the oscillation frequency of circuit 100 across a predetermined frequency range.

As current $I_{bias}$ flows though inductor 105, current $I_{bias}$ is divided between inductors 105a and 105b. For simplicity of understanding how current $I_{bias}$ flows between inductors 105a and 105b, current $I_{bias}$ can be divided into component currents of a common mode current, denoted as $I_{CM}$, and a differential current, denoted as $I_{diff}$. The current $I_{CM}$ can be considered a quantity of common DC current flowing symmetrically within each of inductors 105a and 105b.

In illustration, in a balanced condition of circuit 100, i.e., $(V_{out+})-(V_{out-})$=zero volts, the current sourced through each of NMOSs 120 and 125 is approximately equal to one half of the current $I_{bias}$. Accordingly, the current flowing through each of inductors 105a and 105b is approximately equal to one half of the current $I_{bias}$. The current value of one half $I_{bias}$ can be considered the common mode current sourced through each of NMOSs 120 and 125. As circuit 100 oscillates, the current flowing through NMOS 120 increases as current flowing through NMOS 125 decreases. Then, in succession, the current flowing through NMOS 120 decreases as the current flowing through NMOS 125 increases. Thus, the current flowing through inductor 105a increases as the current flowing through inductor 105b decreases. Then, in succession, the current flowing through inductor 105a decreases as the current flowing through inductor 105b increases.

This directional change in the current flow through inductors 105a and 105b can be considered the AC differential current, $I_{diff}$, flowing through inductor 105. As inductor 105 is a center tap, single turn inductor and, accordingly, inductors 105a and 105b are physically symmetrical to each other, the current $I_{diff}$ represents an asymmetric flow of current through inductors 105a and 105b. For example, PMOS current source 115 of circuit 100 can be biased to generate a current $I_{bias}$ equal to approximately 100 mA. In that case, the current $I_{CM}$ flowing through each of inductors 105a and 105b is equal to approximately 50 mA.

At a subsequent time T1, as circuit 100 oscillates, approximately 75 mA can be flowing out of inductor 105a to node 145 and approximately 25 mA can be flowing out of inductor 105b to node 150. In that case, a current $I_{diff}$ of approximately 25 mA can be considered to be flowing from node 150 to node 145 through inductor 105. Although illustrated in FIG. 1 with an arrow indicating a single direction for current $I_{diff}$, current $I_{diff}$ can flow in either direction through inductor 105. The distinction between common mode current and differential current is significant to the performance of inductor 105 as the current $I_{CM}$ flows symmetrically on either side of center terminal 140 though inductor 105 while the current $I_{diff}$ flows asymmetrically, in either direction, across inductor 105.

The current flowing through each of NMOSs 120 and 125 is summed at node 135 and returned to source 130. As circuit 100 is a closed path between the positive voltage potential of source 130 and the negative voltage potential of source 130, the current received at center terminal 140 is equal to the current returned to the negative voltage potential of source 130. Accordingly, the current returned to the negative voltage potential of source 130 is equal to $I_{bias}$.

Return 155 within circuit 100 of FIG. 1 represents the return pathway for current from the source of each of NMOSs 120 and 125 to the negative voltage potential of source 130. When implemented as a physical circuit within an IC, return 155 represents one or more segments of interconnect material that couple the source of each of NMOSs 120 and 125 to a ground bus implemented within a conductive layer of the IC located some finite distance from the source of each of NMOSs 120 and 125.

Depending upon the location and manner of routing the interconnect material that couples the source terminal of each of NMOSs 120 and 125 to source 130, the interconnect material of return 155 can couple to inductor 105. The manner of this coupling can be both capacitive and inductive. Asymmetries in routing the interconnect of return 155 to return current $I_{bias}$ to source 130, relative to inductor 105, can result in asymmetric coupling of return 155 to inductor 105. In addition, asymmetries in the current flowing within differing segments of the interconnect material of return 155 can result in asymmetric inductive coupling of return 155 to inductor 105.

The coupling of other devices and physical features, e.g., metal interconnect, within a physical implementation of circuit 100 in an IC can impact circuit parameters of inductor 105 and, accordingly, circuit 100. In illustration, other IC devices and physical features coupling to inductor 105 can alter the inductance value of inductor 105, thereby shifting the center frequency of circuit 100. Asymmetric coupling of return 155 to inductor 105 can affect the inductive value of one of inductors 105a and 105b more significantly than the other, thereby degrading the differential integrity of circuit 100. In addition, asymmetric coupling of common mode noise to inductor 105 can couple more of the common mode noise to one of inductors 105a and 105b than the other. The asymmetric coupling of common mode noise, noise that is inherently reduced by a differential circuit, to inductors 105a and 105b can result in common mode noise being converted to differential noise.

Figure 2:
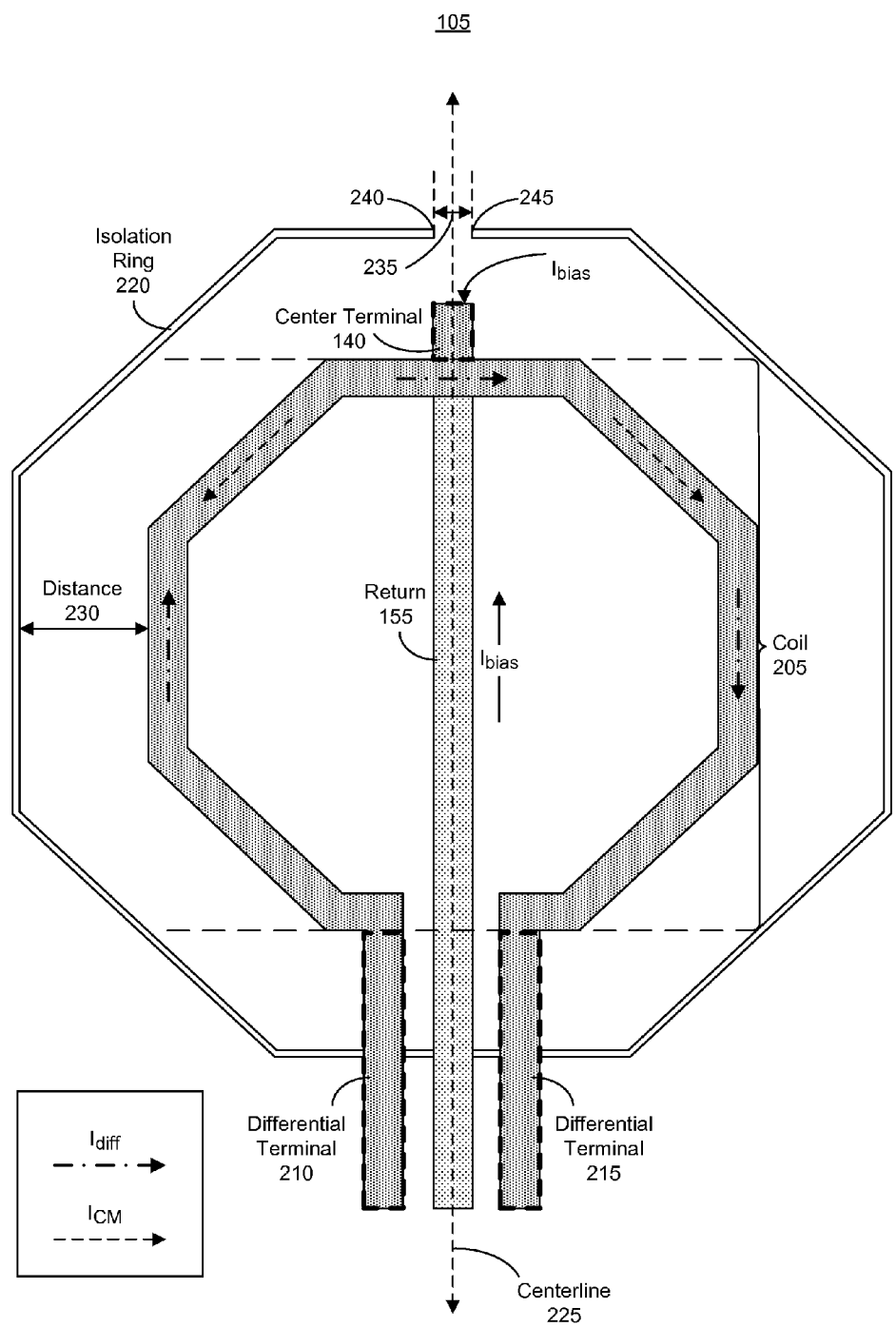
FIG. 2 is a first block diagram illustrating a topographical view of an inductor structure in accordance with another embodiment disclosed within this specification.

FIG. 2 is a second block diagram illustrating a topographical view of an inductor structure (inductor) 105 in accordance with another embodiment disclosed within this specification. FIG. 2 illustrates a physical layout representation, as implemented within an IC, of the single turn, center tap inductor 105 discussed with reference to FIG. 1. As such, like numbers will be used to refer to the same items throughout this specification. Inductor 105 can include a coil 205, a center terminal 140, differential terminals (terminals) 210 and 215, a return 155, and an isolation ring 220.

Although denoted as four distinct objects for descriptive purposes within this specification, coil 205, center terminal 140, and terminals 210 and 215 are coupled together and represent one continuous area of conductive material. In addition, though implemented as one continuous area or segment of conductive material, coil 205, center terminal 140, and terminals 210 and 215 can be implemented within one or more different conductive layers of the IC. The conductive layers can be coupled together with one or more vias to create one continuous conductive pathway.

Coil 205 can be implemented as a symmetrical, single turn coil of inductor 105. A centerline 225 can be determined that symmetrically bisects coil 205. Each segment of coil 205 residing on a particular side of centerline 225 can represent a physical layout of one of inductors 105a and 105b as described with reference to FIG. 1. Although implemented as an octagonal coil within FIG. 2, coil 205 can be implemented in any of a variety of forms or shapes that can be implemented using available IC manufacturing processes so long as the symmetry of coil 205 about centerline 225 is retained. As such, the implementation of coil 205 as an octagonal coil within inductor 105 is provided for clarity and descriptive purposes only, and is not intended to be limiting.

When implemented within an RF differential circuit, e.g. circuit 100 of FIG. 1, inductor 105 can receive bias current $I_{bias}$ at center terminal 140. As noted earlier within this specification, center terminal 140 is located at the midpoint of the length of coil 205, thereby assuring that each side of coil 205 is symmetric and of equal inductive value. Each of terminals 210 and 215 can be coupled to a differential output node of the RF differential circuit in which inductor 105 is implemented. As described earlier within this specification, when the RF differential circuit is in a balanced condition, the common mode current $I_{CM}$ that is sourced from each of terminals 210 and 215 is approximately equal to one half of $I_{bias}$.

As the RF differential circuit switches state, a differential current, $I_{diff}$, can alternately flow in either direction within coil 205. As $I_{diff}$ alternates in direction of flow, the quantity of current associated with $I_{diff}$ also varies. With the current within coil 205 described in this manner, the current flowing through coil 205 can be represented as the sum of $I_{CM}$ and $I_{diff}$ flowing through terminals 210 and 215 at any particular time.

For example, center terminal 140 can receive a current $I_{bias}$ of approximately 100 mA. As a result, the common mode current flowing through each of terminals 210 and 215 can be approximately 50 mA. At a time T1, approximately 75 mA can be flowing out of terminal 210 and approximately 25 mA can be flowing out of terminal 215. In that case, at time T1, a differential current of approximately 25 mA flows in coil 205 from terminal 215 to terminal 210. The distinction between common mode current and differential current is significant to the performance of inductor 105 as $I_{CM}$ flows symmetrically on either side of centerline 225 while $I_{diff}$ flows alternately in either direction across centerline 225.

Return 155 can be implemented with a segment of conductive material disposed within a conductive layer of the IC manufacturing process used to implement inductor 105. In one embodiment, the length of return 155 can be approximately equal in length to a diameter of coil 205 the centerline 225 and further can be located substantially within coil 205. The conductive layer in which return 155 is implemented can be a conductive layer that is different from the conductive layer used to implement coil 205, center terminal 140, and/or terminals 210 and 215. Implementing return 155 in this manner prevents one or more of coil 205, center terminal 140, or differential terminals 210 and 215 from being coupled to return 155. Further, through return 155, the current flowing through each side of coil 205, is summed and returned to source 130, which can be located at the end of return 155 adjacent to, or near, center terminal 140. Return 155 can be disposed on centerline 225, thereby symmetrically bisecting inductor 105, i.e., coil 205. The implementation of return 155 on centerline 225 assures that current used within inductor 105 is routed symmetrically back through inductor 105 to the lowest potential. Additionally, the implementation of return 155 on centerline 225 assures that the conductive material used to return the current used within inductor 105 back to the lowest potential is routed symmetrically through inductor 105.

Implementing return 155 in this manner assures that any coupling induced by returning bias current to the lowest potential or by the interconnect material used to return bias current to the lowest potential is symmetrically applied to either side of coil 205 as bisected by centerline 225. Retaining this symmetry allows the retention of the matched inductive properties between each side of coil 205. As each section of coil 205 residing on either side of centerline 225 implements an individual inductor, e.g., inductors 105a and 105b as described with reference to FIG. 1, the matching of the inductive value of each side of coil 205 is required to assure differential signal balance within a circuit implemented with inductor 105. Any common mode noise coupled to coil 205 asymmetrically to one side of centerline 225 can be converted to a differential noise that can appear within the differential output signal of any differential circuit in which inductor 105 is implemented.

Isolation ring 220 can include one or more substrate taps coupled to a segment of conductive material residing within a conductive layer of an IC manufacturing process used to implement inductor 105. In another embodiment, the lowest residing conductive layer of the IC manufacturing process, and therefore, the conductive layer vertically closest to the substrate taps, can be used to implement the segment of conductive material that is coupled to the substrate tap(s). The conductive material of isolation ring 220 can be coupled via one or more interconnects to a lowest voltage potential available within the IC in which inductor 105 is implemented, e.g., ground. In one aspect, isolation ring 220 can be said to electromagnetically couple to coil 205.

Isolation ring 220 can surround coil 205 at a constant and predetermined distance 230 from an outer perimeter of coil 205. For example, coil 205 and isolation ring 220 can be concentric with respect to one another. Coil 205 and isolation ring 220 further can have a same shape despite isolation ring 220 being sized to surround coil 205 and being implemented within different conductive layers of the IC.

As IC inductor structures reside over a conductive substrate material that is common to the entire IC, noise from surrounding devices can be injected into the substrate material residing directly beneath the inductor structure. The coils of an inductor structure are generally implemented within the conductive layer(s) farthest from the substrate layer and are separated from the substrate layer by one or more dielectric layers. Despite this isolation, both inductive and capacitive coupling can exist between the coils of the conventional inductor structure and the underlying substrate. For this reason, isolation rings can be located around the inductor structure and coupled to a common substrate voltage potential such as, for example, the ground potential of the IC. Coupling the substrate underlying the inductor structure to ground improves isolation of the underlying substrate from substrate noise injected by devices surrounding the inductor structure.

Typically, the isolation rings used within a conventional IC inductor structure form a continuous substrate ring surrounding the inductor coils of the conventional IC inductor. As the conventional isolation ring is continuous, it forms a coil surrounding the coils of the conventional IC inductor. As a result, a mutual inductance exists between the coils of the conventional IC inductor and the coil formed by the conventional isolation ring. Through mutual inductance, a time varying differential current within the conventional IC inductor can generate a magnetic field that induces a current flow within the conventional isolation ring. The current generated within the conventional isolation ring generates a magnetic field that opposes the current flow within the conventional IC inductor. This opposing magnetic field reduces the absolute inductive value for the conventional IC inductor when operating within a circuit.

As such, the mutual inductance between the conventional isolation ring and the conventional IC inductor decreases the inductive value of the conventional IC inductor structure. In addition, as the distance between the conventional isolation ring and the coils of the conventional inductor structure decreases, the mutual inductance between the conventional isolation ring and the coils of the conventional inductor structure increases, and the absolute inductive value of the conventional IC inductor structure decreases. The reduction in the inductive value of the conventional IC inductor structure from inductive coupling to the conventional isolation ring can approach 20 percent of the inductive value of the conventional IC inductor structure in the absence of the conventional isolation ring.

To counter the effect of the conventional isolation ring on inductance values, isolation ring 220 includes an opening that creates a discontinuity within isolation ring 220. Unlike the conventional isolation ring, isolation ring 220 does not form a continuous coil surrounding coil 205. Ends 240 and 245 of isolation ring 220 are proximate to center terminal 140, e.g., at an opposing end of inductor 105 from differential terminals 210 and 215, and are separated by a predetermined distance 235 defining the opening. In another embodiment, the opening can be centered over centerline 225. In that case, each of ends 240 and 245 of isolation ring 220 can be equidistant from centerline 225. As illustrated, the opening is aligned with center terminal 140 on centerline 225, e.g., aligned on a same axis. A portion of isolation ring, e.g., a location opposite the opening, can be coupled to return 155, as will be illustrated in greater detail within this specification.

The opening in isolation ring 220 can inhibit the circulation of current around isolation ring 220 by breaking the current pathway through isolation ring 220. The decrease in current flow within isolation ring 220 can reduce the impact of inductive coupling between coil 205 and isolation ring 220 upon the inductive value of inductor 105. For example, the inclusion of the opening defined by distance 235 between ends 240 and 245 within isolation ring 220 can reduce the effect that any variation in distance 230 has upon the inductive value of inductor 105.

Similar to the way in which isolation ring 220 forms a coil that interacts with inductor 105, segments of conductive material used to interconnect circuit blocks within an IC can form coils that interact with inductor 105. In particular, power supply lines within an IC, e.g., VDD and ground, which are typically implemented with large areas of conductive material, are more likely to interact with inductor 105. In order to form a coil that interacts with inductor 105, a power supply line must bisect coil 205 of inductor 105 in a manner that crosses centerline 225. When the power supply line remains on one side of centerline 225, the impact of differential current flowing across differential terminal 210 and 215 on the power supply line is minimal.

By allowing a supply line to cross centerline 225, differential currents flowing across coil 205 can induce current within the power supply line that crosses centerline 225. The current induced within the power supply line can generate magnetic fields that affect the inductive value of inductor 105. For this reason, when implemented within an IC layout, no power supply lines of the IC can reside within a perimeter defining inductor 105, or within a predetermined spacing from the perimeter defining inductor 105, that crosses centerline 225. In one embodiment, isolation ring 220, e.g., an outer edge of isolation ring 220, can be the perimeter defining inductor 105.

By implementing return 155, the opening in isolation ring 220, and preventing supply lines from crossing centerline 225 as described, a center tap inductor can be implemented that exhibits greater differential symmetry and a more stable inductive value. The use of the various structural elements described with reference to FIG. 2, a reduction in the variation of the inductive value of inductor 105 to approximately 2 percent of the designed inductive value can be achieved.

Figure 3:
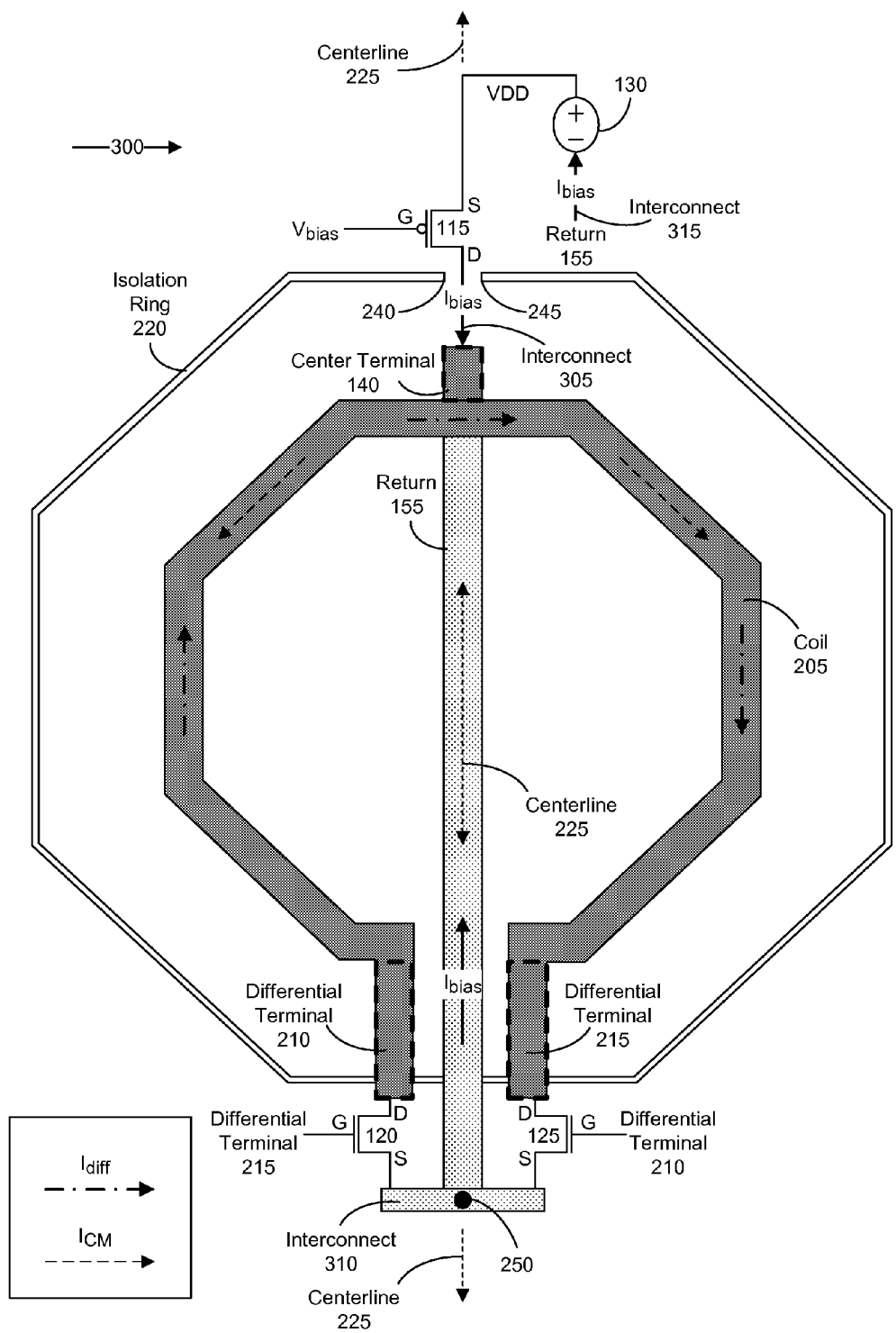
FIG. 3 is a second block diagram illustrating a graphical representation of an inductor structure in accordance with another embodiment disclosed within this specification.

FIG. 3 is a second block diagram providing a graphical representation of an inductor structure in accordance with another embodiment disclosed within this specification. More particularly, FIG. 3 illustrates further aspects of inductor 105. Accordingly, FIG. 3 is intended to provide a better understanding of electrical and electromagnetic properties of inductor 105 and the influence of those properties upon the operation of circuit 100 of FIG. 1. As such, circuit diagram representations of components such as PMOS 115, NMOSs 120 and 125, and VDD are superimposed to illustrate the operational context in which inductor 105 exists and operates within circuit 100.

Referring to FIG. 3, a drain terminal of PMOS 115 is coupled to center terminal 140 via an interconnect 305. As previously described within this specification, PMOS 115 functions as a current source for the current $I_{bias}$ from a positive voltage potential of source 130 to circuit 100. When implemented within an IC layout, interconnect 305 can be routed to inductor 105 along centerline 225, thereby retaining the structural and current symmetry within inductor 105.

Differential terminal 210 is coupled to a drain terminal of NMOS 120. A gate terminal of NMOS 120 is coupled to differential terminal 215. Differential terminal 215 is coupled to a drain terminal of NMOS 125. A gate terminal of NMOS 125 is coupled to differential terminal 215. Implemented in this manner, NMOSs 120 and 125 form a cross-coupled differential pair. The source terminal of each of NMOSs 120 and 125 is coupled to interconnect 310. The common mode and differential current flowing through the source terminal of each of NMOSs 120 and 125, when summed within interconnect 305, is approximately equal to $I_{bias}$. Interconnect 310 graphically represents the metal interconnect necessary to couple the source terminal of each of NMOSs 120 and 125 to return 155. In order to retain the structural and current symmetry within inductor 105, interconnect 310 can be symmetrically coupled to a first end of return 155 adjacent to differential terminals 210 and 215.

A second end of return 155, adjacent to center terminal 140, can be coupled to a negative voltage potential of source 130. Interconnect 315 is used to couple return 155 to the negative voltage potential of source 130. Interconnect 315 can be routed out of inductor 105 along centerline 225 to source 130. Coupled in this manner, current $I_{bias}$ can be returned via return 155 and interconnect 315 to source 130. For example, interconnect 315 can be located in a different conductive layer to facilitate routing along central line 225. In addition, routing interconnects 305, 310, and 315 in this manner assures that current $I_{bias}$ is routed to flow symmetrically into, and out of, inductor 105 along centerline 225. This symmetric routing approach prevents the formation of loops within inductor 105 that can couple to coil 205 that can vary the total inductance value of inductor 105 or inject external noise into inductor 105.

The coupling of substrate noise can be further minimized by the coupling of isolation ring 220 to return 155 at location 250. Coupling isolation ring 220 to return 155 at location 250 electrically bisects isolation ring 220 into two symmetric segments about centerline 225. Location 250, also representing an electrical node, can correspond to a virtual AC ground of circuit 100 for differential current flowing within coil 205 and accordingly, induced current within isolation ring 220. As used within this specification, the term "virtual AC ground," refers to a node of a circuit that is maintained at a steady voltage potential when sourcing or sinking AC current without being directly physically coupled to a reference voltage potential. Coupling isolation ring 220 to the virtual AC ground at location 250 minimizes the ability of isolation ring 220 to form a loop that interacts with any segment of coil 205. In addition, coupling the isolation ring 220 in this manner minimizes the influence of isolation ring 220 upon the inductive value of inductor 105.

The example illustrated within FIG. 3 is not intended to limit the one or more embodiments disclosed within this specification. For example, various devices illustrated in circuit schematic form can be replaced with one or more other passive and/or active devices. In this regard, for example, differential terminal 210 and differential terminal 215 can be coupled to location 250 and return 155 through one or more active devices, passive devices, or combinations of active and passive devices other than those shown. In general, the devices through which differential terminal 210 couples to return 155 will be the same as the devices through which differential terminal 215 couples to return 155, though this need not be the case. In similar fashion, center terminal 140 can couple to return 155 through one or more other types of circuit elements that are different from those illustrated in FIG. 3.

Figure 4:
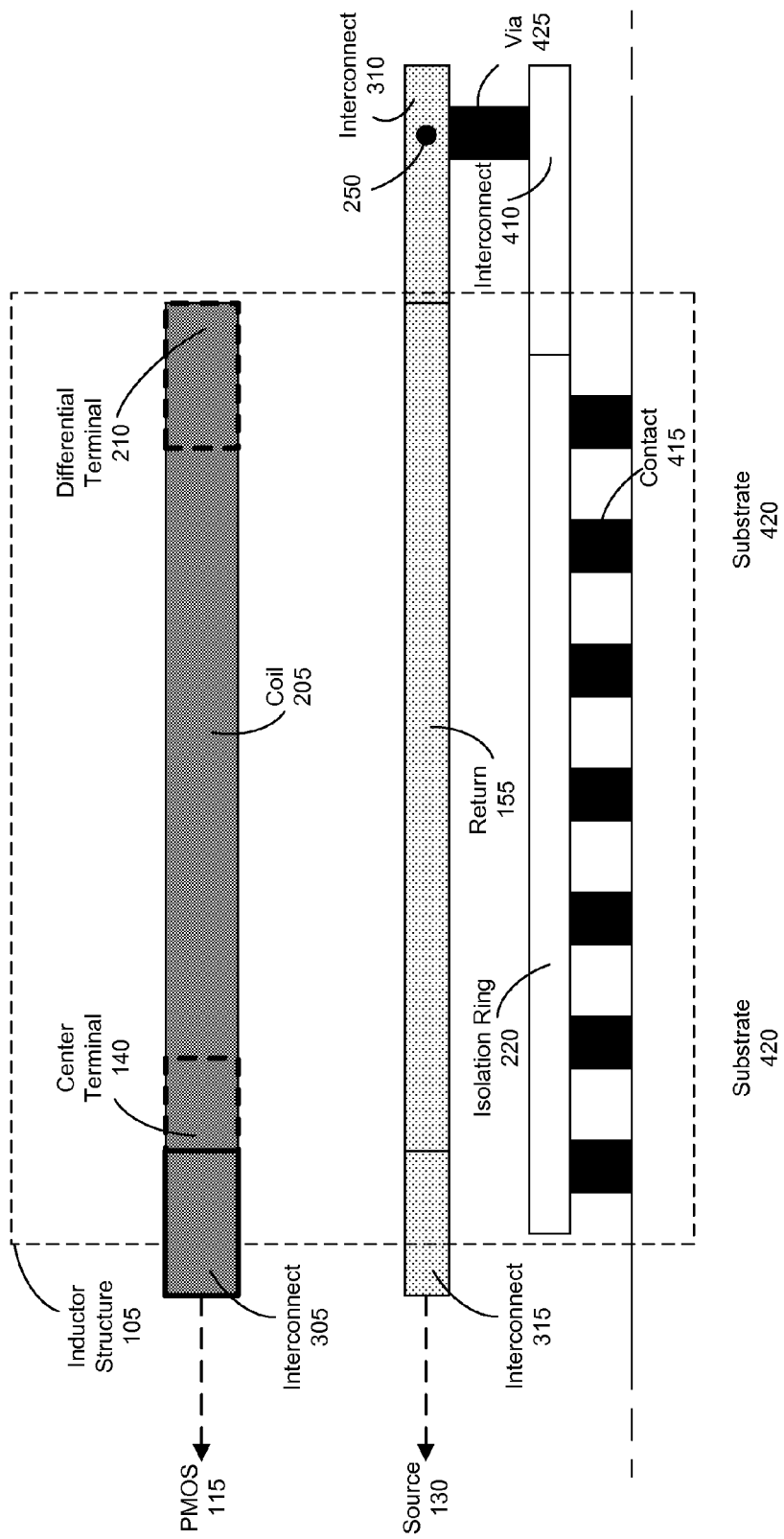
FIG. 4 is a third block diagram illustrating a side view of an inductor structure in accordance with another embodiment disclosed within this specification.

FIG. 4 is a third block diagram providing a side view of an inductor structure in accordance with another embodiment disclosed within this specification. FIG. 4 shows a side view of inductor 105 of FIG. 3 taken from the perspective of directional arrow 300. It should be noted that within FIG. 4 being a side view, one or more objects visible within FIG. 3 may not be visible within FIG. 4. Similarly, one or more objects that appear within FIG. 4 may not be visible within FIG. 3.

Referring to FIG. 4, three distinct conductive layers are used to implement the elements of inductor 105. Although implemented with three conductive layers, inductor 105 can be implemented with one or more additional conductive layers. As such, the implementation of inductor 105 with three conductive layers within this specification is provided for clarity and descriptive purposes only, and is not intended to be limiting. For example, inductor 105 can be implemented using four conductive layers. In that case, coil 205 can be implemented using two adjacent conductive layers coupled together by vias. In this manner, the quality factor, i.e., Q, of coil 205 can be improved by reducing the series resistance associated with coil 205.

Continuing with FIG. 4, center terminal 140, coil 205, and differential terminal 210 are implemented with a single continuous segment of conductive material within a conductive layer farthest from a substrate layer shown as substrate 420. It should be noted that within FIG. 4, differential terminal 215 is obstructed from view by differential terminal 210.

Return 155 is implemented within a conductive layer residing between the conductive layer used to implement coil 205 and substrate 420. In the example pictured in FIG. 4, return 155 is implemented within a conductive layer between the conductive layer in which coil 205 is implemented and the conductive layer in which isolation ring 220 is implemented. Generally, inductors are implemented within ICs using the conductive layer(s) farthest from substrate 420. Typically, these upper conductive layer(s) of an IC manufacturing process are thicker than lower residing conductive layers and, as a result, create inductors with lower series resistance and higher Q. Although implemented below coil 205 as shown in FIG. 4, return 155 also can be implemented within one or more conductive layers that reside above the conductive layer(s) used to implement coil 205. As such, the implementation of return 155 as illustrated within FIG. 4 of this specification is provided for clarity and descriptive purposes only, and not intended to be limiting.

Interconnect 305 represents a region of conductive material that couples center terminal 140 of inductor 105 to a drain terminal of PMOS 115. Interconnect 310 represents a region of conductive material that couples return 155 to a source terminal of each of NMOSs 120 and 125. Interconnect 315 represents a region of conductive material that couples return 155 to a positive potential of source 130. Although illustrated as a single layer of conductive material, each of interconnects 305, 310, and 315 can be implemented using one or more conductive layers and one or more vias that couple adjacent conductive layers to form each respective one of interconnects 305, 310, and/or 315. As such, the implementation of each of interconnects 305, 310, and 315 with a single region of conductive material within this specification is provided for clarity and descriptive purposes only, and not is intended to be limiting.

Isolation ring 120 is implemented within a conductive layer residing closest to substrate 420. Each contact 415 couples a segment of isolation ring 120 to an underlying area of substrate 420. Although implemented within the conductive layer nearest to substrate 420, isolation ring 220 can be implemented within any conductive layer(s) available within an IC manufacturing process. As such, the implementation of isolation ring 220 in the conductive layer closest to substrate 420 and the number of contacts 415 as illustrated within FIG. 4 is not intended to be limiting.

Interconnect 410 represents a region of conductive material that couples isolation ring 220 to interconnect 310. Interconnect 410 is coupled to interconnect 310 at location 250 with one or more of vias 425. Accordingly, though illustrated as single layer of conductive material, interconnect 410 can be implemented as one or more conductive layers that couple interconnect 410 to interconnect 310.

In one or more embodiments, location 250 can be located at an AC virtual ground for the circuit in which inductor 105 is implemented. In that case, interconnect 410 can be physically connected to isolation ring 220 at location 250 so that isolation ring 220 is symmetrically bisected at a midpoint of the length of isolation ring 220 along the centerline of inductor 105. Coupling isolation ring 220 to interconnect 310 in this manner can minimize the size any loop formed by isolation ring 220 that may couple to a segment of coil 205. Minimizing the coupling of loops formed by isolation ring 220 to coil 205 reduces any variability in the induction value of inductor 105 that may be caused by the proximity of isolation ring 220 to coil 205.

Figure 5:
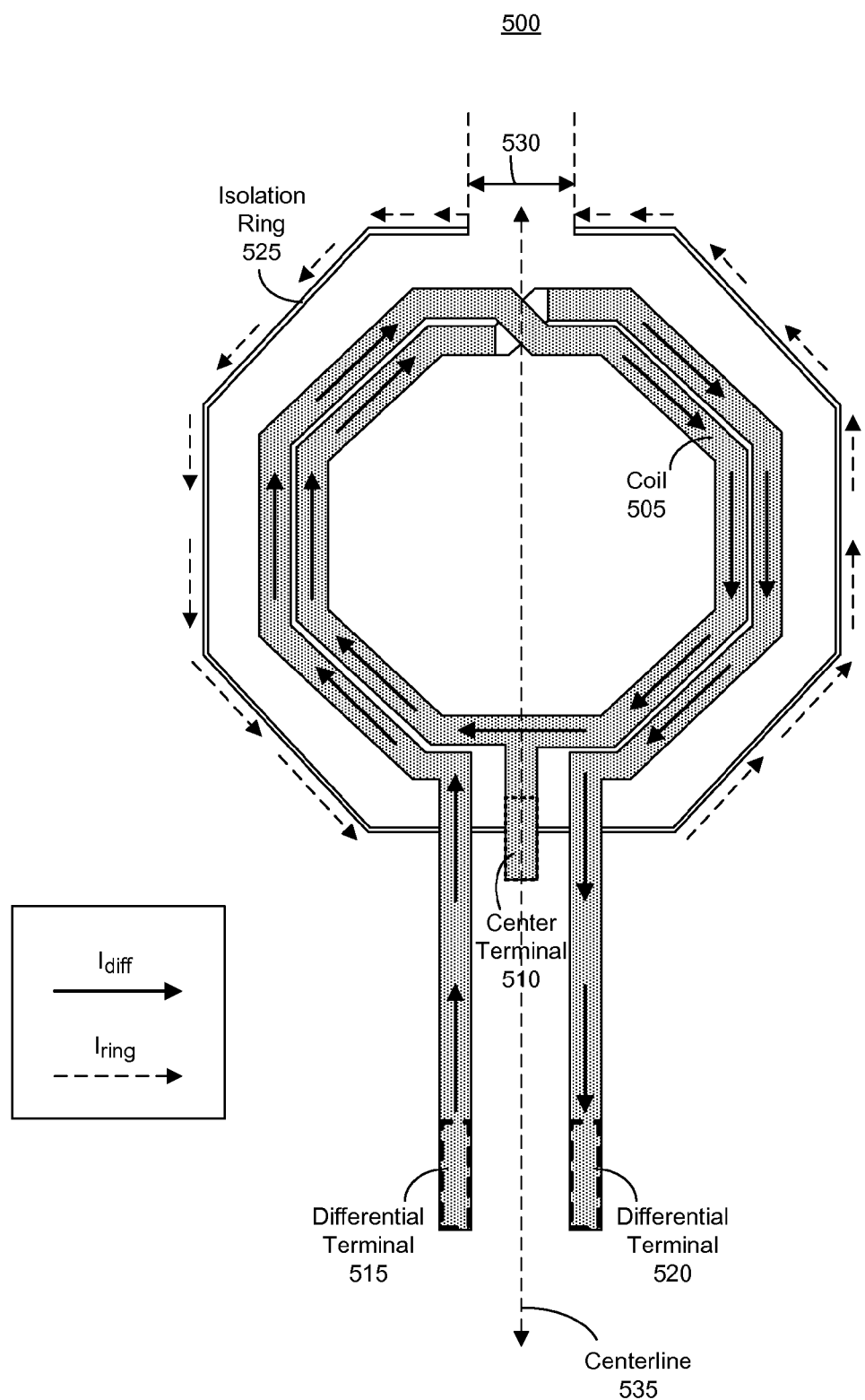
FIG. 5 is a fourth block diagram illustrating a two turn center tap inductor structure in accordance with another embodiment disclosed within this specification.

FIG. 5 is a fourth block diagram illustrating a two turn center tap inductor structure (inductor) 500 in accordance with another embodiment disclosed within this specification. Inductor 500 illustrates the use of an isolation ring feature, as described with this specification as applied to a center tap inductor structure implemented with two or more turns. Inductor 500 can be used within differential RF circuits as described with reference to inductor 105 of FIG. 1. FIG. 5 illustrates further aspects and performance improvements that result from providing a symmetric opening within an isolation ring surrounding inductor 500.

Inductor 500 can include a coil 505, a center terminal 510, differential terminals (terminals) 515 and 520, and an isolation ring 525. As inductor 500 is intended for use within a differential RF circuit, generally, a bias current is received at center terminal 510. A portion of the bias current is output to the differential RF circuit at each of terminals 520 and 515. Although referenced as four distinct objects for descriptive purposes within this specification, coil 505, center terminal 510, and terminals 515 and 520 are coupled together and represent one continuous area or segment of conductive material. In addition, each of coil 505, center terminal 510, and/or terminals 515 and 520 can be implemented within one or more different conductive layers of the IC. The conductive layers can be coupled together with one or more vias to create one continuous conductive pathway.

Coil 505 is implemented as a symmetrical two turn coil of inductor 500. A centerline 535 can be determined that symmetrically bisects coil 505. Although implemented as a two turn octagonal coil within FIG. 5, coil 505 can include two or more turns implemented in any of a variety of forms or shapes allowable by an IC manufacturing process so long as the symmetry of coil 505 is retained about centerline 535. As such, the implementation of coil 505 as a two turn octagonal coil within inductor 500 is provided for clarity and descriptive purposes only, and is not intended to be limiting. In another embodiment, for example, the turns of coil 505 can be stacked with each turn of the coil implemented within a differing conductive layer of the IC. Each turn implemented within a different conductive layer can be coupled to a turn in an adjacent conductive layer by one or more vias to form a continuous coil.

Isolation ring 525 can include one or more substrate taps coupled to a segment of conductive material residing within a conductive layer of an IC manufacturing process used to implement inductor 500. In another embodiment, the lowest conductive layer of the IC manufacturing process, and therefore, the conductive layer vertically closest to the substrate taps, can be used to implement the segment of conductive material that is coupled to the substrate tap(s). The conductive material of isolation ring 525 can be coupled via interconnect material within the IC to a lowest voltage potential available within the IC in which inductor 500 is implemented, e.g., ground. Isolation ring 525 can surround coil 505 at a constant and predetermined distance from an outer perimeter of coil 505. In another embodiment, isolation ring 525 can be coupled at the midpoint of the length of isolation ring 525 to a virtual AC ground located within the circuit in which inductor 500 is implemented.

FIG. 5 illustrates the influence of mutual inductance between coil 505 and isolation ring 525 upon current flow within coil 505 and isolation ring 525. Within coil 505, $I_{diff}$, being a time varying differential current, flows from terminal 515 to terminal 520. As noted within this specification, unlike common mode current that flows symmetrically in either direction away from center terminal 510, $I_{diff}$ flows across inductor 500. As such, $I_{diff}$ flows asymmetrically through inductor coil 505 with respect to centerline 535. The flow of $I_{diff}$ though inductor 500 generates a magnetic field that induces a current within isolation ring 525, denoted as $I_{ring}$, that flows in the opposite direction of $I_{diff}$.

Current $I_{ring}$ generates a magnetic filed that opposes the flow of current $I_{diff}$ through coil 505. As previously discussed within this specification, in conventional IC inductor structures the unimpeded flow of current within an isolation ring can impact the inductive value of the conventional IC inductor structure. The opening of length 530 within isolation ring 525 serves to break the pathway for current $I_{ring}$ flowing within isolation ring 525. Within FIG. 5, the length of the arrows used to represent current $I_{ring}$ illustrates the current density of current $I_{ring}$ at various locations within isolation ring 525. Referring to FIG. 5, the current density of current $I_{ring}$ is lowest within locations nearest to the opening and highest within locations farthest from the opening.

Accordingly, the magnetic field generated within isolation ring 525 by current $I_{ring}$ is weakest at locations nearest to the opening and strongest at locations farthest from the opening. As a result, the coupling between coil 505 and isolation ring 525 is weakest at locations nearest to the opening and strongest at locations farthest from the opening. Although the current density within isolation ring 525 decreases at locations nearest to the opening, the variation in current density is symmetric within isolation ring 525 on either side of the opening within isolation ring 525 as bisected by centerline 535. Locating the center of the opening along centerline 535 assures the variation in the current density of current $I_{ring}$ and, accordingly, the level of coupling between coil 505 and isolation ring 525, is symmetric within inductor 500 with respect to centerline 535.

To illustrate the importance of the opening being symmetrically bisected by centerline 535, assume isolation ring 525 is rotated clockwise 90 degrees. As coupling between coil 505 and isolation ring 525 is weakest near the opening, the coupling between coil 505 and isolation ring 525 is weaker within the side of coil 505 that includes terminal 520 than the side of coil 505 that includes terminal 515. The asymmetry in the coupling between coil 505 and isolation ring 525 created by not centering the opening within isolation ring 525 over centerline 535 can lead to the conversion of common mode signals to differential signals.

Continuing with the previous illustration in which isolation ring 525 is rotated clockwise 90 degrees, a ground potential coupled to isolation ring 525 can contain a quantity of noise. The noise signal can be coupled by isolation ring 525 to coil 505. As the rotation of the opening results in asymmetric levels of coupling between each side of coil 505 and isolation ring 525, more of the noise signal is coupled to the side of coil 505 containing terminal 515 than the side containing terminal 520. The difference in the power of the noise signal within one side of coil 505 from the other side of coil 505 appears as a differential noise signal within the circuit in which inductor 500 is implemented.

Centering the opening of isolation ring 525 over centerline 535 assures that a noise signal is symmetrically coupled to each side of coil 505. In that case, the noise signal appears as a common mode signal which is inherently cancelled at some level by a typical differential circuit. The same coupling asymmetries can also influence the inductive value match of the dual inductors inherent within inductor 500.

One or more embodiments disclosed within this specification provide a center tap IC inductor structure that demonstrates improved matching characteristics and improved immunity to coupling effects than conventional inductor structures. The IC inductor structure can be built symmetrically with respect to a centerline that bisects the center tap of the IC inductor structure. An isolation ring can be built that surrounds the outer perimeter of the coils of the center tap IC inductor structure. The isolation ring can be discontinuous in that the isolation ring can include an opening centered about the centerline. The discontinuity in the isolation ring impedes induced current from flowing within the isolation ring. In the case of a single turn center tap inductor structure, a return line can be added to the inductor structure. The return line can be centered symmetrically along the centerline and return current sourced from the IC inductor structure on a path that symmetrically bisects the single turn coil of the IC inductor structure.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, e.g., circuit components such as one or more active and/or passive devices, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. An inductor structure implemented within a semiconductor integrated circuit (IC), the inductor structure comprising:
    a coil of conductive material that comprises a center terminal located at a midpoint of a length of the coil;
    wherein the coil is symmetrical with respect to a centerline bisecting the center terminal;
    wherein the coil comprises a first differential terminal and a second differential terminal each located at an end of the coil opposite the center terminal; and
    a return line of conductive material coupled to the coil and located in a different conductive layer of the IC than the coil;
    wherein the return line is positioned on the centerline.

2. The inductor structure of claim 1, further comprising an isolation ring that surrounds the coil and is separated from the coil by approximately a constant and predetermined distance.

3. The inductor structure of claim 2, wherein the isolation ring comprises a first end and a second end separated by a predetermined distance forming an opening.

4. The inductor structure of claim 3, wherein the isolation ring is coupled, at a midpoint of a length of the isolation ring, to a virtual AC ground when in a circuit in which the inductor structure is implemented.

5. The inductor structure of claim 3, wherein the first end and the second end of the isolation ring are equidistant from the centerline.

6. The inductor structure of claim 3, wherein the isolation ring is coupled to the return line at a location opposite the center terminal.

7. The inductor structure of claim 2, wherein:
    no supply voltage interconnect and no ground interconnect are located within the isolation ring; and
    no supply voltage interconnect and no ground interconnect cross the centerline within a predetermined distance of the isolation ring.

8. The inductor structure of claim 1, wherein a length of the return line is approximately equal to a diameter of the coil at the centerline.

9. An inductor structure implemented within a semiconductor integrated circuit (IC), the inductor structure comprising:
    a coil of conductive material comprising a center terminal located at a midpoint of a length of the coil;
    wherein the coil is symmetrical with respect to a centerline bisecting the center terminal;
    wherein the coil comprises a first differential terminal and a second differential terminal each located at an end of the coil opposite the center terminal;
    a return line of conductive material located in a different conductive layer of the IC than the coil;
    wherein the return line is positioned on the centerline substantially within the coil; and
    an isolation ring surrounding the coil and separated from the coil by approximately a constant and predetermined distance;
    wherein the isolation ring comprises a first end and a second end separated by a predetermined distance forming an opening in the isolation ring.

10. The inductor structure of claim 9, wherein a length of the return line is approximately equal to a diameter of the coil at the centerline.

11. The inductor structure of claim 9, wherein:
    the first end and the second end of the isolation ring are equidistant from the centerline; and
    the first end and the second end of the isolation ring are located closer to the center terminal than either of the differential terminals of the coil.

12. The inductor structure of claim 9, wherein the isolation ring is coupled to an end of the return line that is opposite the center terminal.

13. The inductor structure of claim 9, wherein the isolation ring is coupled, at a midpoint of a length of the isolation ring, to a virtual AC ground when in a circuit in which the inductor structure is implemented.

14. The inductor structure of claim 9, wherein:
    no supply voltage interconnect and no ground interconnect are located within the isolation ring; and
    no supply voltage interconnect and no ground interconnect cross the centerline within a predetermined distance of the isolation ring.

15. An inductor structure implemented within a semiconductor integrated circuit (IC), the inductor structure comprising:
    a plurality of coils of conductive material comprising a center terminal located at a midpoint of a length of the plurality of coils;
    wherein each of the plurality of coils is symmetrical with respect to a centerline bisecting the center terminal;
    wherein the plurality of coils comprises a first differential terminal and a second differential terminal each located at an end of the plurality of coils; and
    an isolation ring surrounding the plurality of coils and separated from the plurality of coils by approximately a constant and predetermined distance;

wherein:
the isolation ring comprises a first end and a second end separated by a predetermined distance forming an opening in the isolation ring;
the first end and the second end of the isolation ring are equidistant from the centerline; and
the first end and the second end of the isolation ring are located external to a portion of the plurality of coils opposite the center terminal, the first differential terminal, and the second differential terminal.

16. The inductor structure of claim 15, wherein the center terminal is located on a same side of the plurality of coils as, and between, the first and second differential terminals.

17. The inductor structure of claim 15, wherein the isolation ring is coupled, at a midpoint of a length of the isolation ring, to a virtual AC ground when in a circuit in which the inductor structure is implemented.

18. The inductor structure of claim 15, wherein:
no supply voltage interconnect and no ground interconnect are located within the isolation ring; and
no supply voltage interconnect and no ground interconnect cross the centerline within a predetermined distance of the isolation ring.

* * * * *